(12) United States Patent
Viswanathan

(10) Patent No.: US 9,837,328 B2
(45) Date of Patent: Dec. 5, 2017

(54) SEMICONDUCTOR DEVICE PACKAGES

(71) Applicant: Freescale Semiconductor, Inc., Austin, TX (US)

(72) Inventor: Lakshminarayan Viswanathan, Phoenix, AZ (US)

(73) Assignee: NXP USA, INC., Austin, TX (US)

(*) Notice: Subject to any disclaimer, the term of this patent is extended or adjusted under 35 U.S.C. 154(b) by 0 days.

(21) Appl. No.: 15/070,308

(22) Filed: Mar. 15, 2016

(65) Prior Publication Data

US 2016/0293508 A1 Oct. 6, 2016

Related U.S. Application Data

(63) Continuation of application No. 14/068,496, filed on Oct. 31, 2013, now Pat. No. 9,312,231.

(51) Int. Cl.
*H01L 23/48* (2006.01)
*H01L 23/52* (2006.01)
(Continued)

(52) U.S. Cl.
CPC .......... *H01L 23/047* (2013.01); *H01L 21/288* (2013.01); *H01L 21/486* (2013.01); *H01L 21/4867* (2013.01); *H01L 21/50* (2013.01); *H01L 23/057* (2013.01); *H01L 23/142* (2013.01); *H01L 23/3121* (2013.01); *H01L 23/3675* (2013.01); *H01L 23/3677* (2013.01); *H01L 23/4924* (2013.01); *H01L 23/49861* (2013.01); *H01L 23/49866* (2013.01); *H01L 24/13* (2013.01); *H01L 24/27* (2013.01); *H01L 24/32* (2013.01); *H01L 24/48* (2013.01); *H01L 24/49* (2013.01); *H01L 24/73* (2013.01); *H01L 24/80* (2013.01); *H01L 24/83* (2013.01); *H01L 25/0655* (2013.01); *H01L 2224/2731* (2013.01); *H01L 2224/29139* (2013.01); *H01L 2224/29339* (2013.01); *H01L 2224/32245* (2013.01); *H01L 2224/48091* (2013.01);
(Continued)

(58) Field of Classification Search
CPC ......... H01L 21/56; H01L 23/54; H01L 23/40; H01L 23/52; H01L 21/47; H01L 21/20
USPC ............. 257/762, 676, 675, E23.02, E23.08; 438/118, 125, 196, 656
See application file for complete search history.

(56) References Cited

U.S. PATENT DOCUMENTS 6,404,065 B1 * 6/2002 Choi .................. H01L 23/3121
257/675
2001/0038140 A1 * 11/2001 Karker ................. H01L 23/057
257/666
(Continued)

*Primary Examiner* — Sheikh Maruf
(74) *Attorney, Agent, or Firm* — Sherry W. Schumm

(57) ABSTRACT

A semiconductor device package that incorporates a combination of ceramic, organic, and metallic materials that are coupled using silver is provided. The silver is applied in the form of fine particles under pressure and a low temperature. After application, the silver forms a solid that has a typical melting point of silver, and therefore the finished package can withstand temperatures significantly higher than the manufacturing temperature. Further, since the silver is an interfacial material between the various combined materials, the effect of differing material properties between ceramic, organic, and metallic components, such as coefficient of thermal expansion, is reduced due to low temperature of bonding and the ductility of the silver.

17 Claims, 4 Drawing Sheets

(51) Int. Cl.
*H01L 29/40* (2006.01)
*H01L 23/047* (2006.01)
*H01L 23/00* (2006.01)
*H01L 23/057* (2006.01)
*H01L 23/31* (2006.01)
*H01L 23/14* (2006.01)
*H01L 23/367* (2006.01)
*H01L 21/50* (2006.01)
*H01L 23/492* (2006.01)
*H01L 23/498* (2006.01)
*H01L 25/065* (2006.01)
*H01L 21/288* (2006.01)
*H01L 21/48* (2006.01)

(52) U.S. Cl.
CPC ............. *H01L 2224/48106* (2013.01); *H01L 2224/48137* (2013.01); *H01L 2224/48225* (2013.01); *H01L 2224/48227* (2013.01); *H01L 2224/48245* (2013.01); *H01L 2224/48247* (2013.01); *H01L 2224/73265* (2013.01); *H01L 2224/8384* (2013.01); *H01L 2224/83447* (2013.01); *H01L 2924/00014* (2013.01); *H01L 2924/01006* (2013.01); *H01L 2924/01013* (2013.01); *H01L 2924/01022* (2013.01); *H01L 2924/01028* (2013.01); *H01L 2924/01029* (2013.01); *H01L 2924/0132* (2013.01); *H01L 2924/0133* (2013.01); *H01L 2924/01042* (2013.01); *H01L 2924/01074* (2013.01); *H01L 2924/01079* (2013.01); *H01L 2924/0461* (2013.01); *H01L 2924/0469* (2013.01); *H01L 2924/1421* (2013.01); *H01L 2924/15738* (2013.01); *H01L 2924/15747* (2013.01); *H01L 2924/15763* (2013.01); *H01L 2924/16152* (2013.01); *H01L 2924/16598* (2013.01); *H01L 2924/171* (2013.01); *H01L 2924/181* (2013.01); *H01L 2924/20106* (2013.01); *H01L 2924/20107* (2013.01); *H01L 2924/20108* (2013.01); *H01L 2924/3025* (2013.01)

(56) References Cited

U.S. PATENT DOCUMENTS

| | | | |
|---|---|---|---|
| 2006/0060954 A1* | 3/2006 | Meyer-Berg | H01L 23/5389 257/685 |
| 2006/0220216 A1* | 10/2006 | Mizuno | H01L 23/5385 257/691 |
| 2007/0045815 A1* | 3/2007 | Urashima | H05K 1/0231 257/698 |
| 2011/0031611 A1* | 2/2011 | Standing | H01L 21/4846 257/700 |
| 2011/0075451 A1* | 3/2011 | Bayerer | H01L 24/06 363/37 |
| 2012/0014069 A1* | 1/2012 | Zeng | H01L 23/4334 361/718 |
| 2012/0153486 A1* | 6/2012 | Kuramoto | H01L 21/187 257/762 |
| 2013/0011972 A1* | 1/2013 | Standing | H01L 23/5389 438/121 |
| 2013/0043571 A1* | 2/2013 | Gowda | H01L 23/3735 257/666 |
| 2013/0049204 A1* | 2/2013 | Oeschler | H01L 24/29 257/772 |
| 2013/0307145 A1* | 11/2013 | Chung | H01L 23/49811 257/737 |
| 2013/0328204 A1* | 12/2013 | Zommer | B23K 1/20 257/765 |
| 2014/0029234 A1* | 1/2014 | Chauhan | H01L 23/3128 361/820 |
| 2014/0361445 A1* | 12/2014 | Nashida | H01L 24/80 257/782 |

* cited by examiner

SEMICONDUCTOR DEVICE PACKAGES

RELATED APPLICATION

This application is a continuation of co-pending, U.S. patent application Ser. No. 14/068,496, filed on Oct. 31, 2013.

BACKGROUND

This disclosure relates generally to semiconductor device packaging, and more specifically, to a low-temperature process for fabricating high temperature and high performance semiconductor device packages.

A variety of semiconductor device packages include a combination of ceramic, organic, and metallic materials. In order to form a usable structure for the semiconductor device package, these differing materials are in contact with one another. These differing materials often have significantly different material properties that can cause failures of a semiconductor device package incorporating the materials. It is therefore desirable to have semiconductor device packages that incorporate materials having differing material properties but that are not subject to failures due to the differing material properties (e.g., coefficient of thermal expansion).

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The figures are not necessarily drawn to scale.

DETAILED DESCRIPTION

Embodiments of the present invention provide for a semiconductor device package that incorporates a combination of ceramic, organic, and metallic materials that are coupled using silver. The silver is applied in the form of fine particles (e.g., nano particle silver) under pressure and a low temperature (e.g., sintering at 250° C.). After application, the silver forms a solid that has a typical melting point of silver (i.e., approximately 962° C.), and therefore the finished package can withstand temperatures significantly higher than the manufacturing temperature. Further, since the silver is an interfacial material between the various combined materials, the effect of differing material properties between ceramic, organic, and metallic components, such as coefficient of thermal expansion, is reduced due to low temperature of bonding and the ductility of the silver. In other embodiments, the silver can be used in place of or in conjunction with copper slugs in printed circuit boards for attachment of heat sinks or large through vias. Such embodiments provide a thinner PCB than is typical for included copper slugs.

Different types of high performance semiconductor device packages incorporate a combination of ceramic, organic, and metallic materials. But differing property characteristics of these materials can cause failures in the resultant package. For example, widely differing coefficients of thermal expansion between ceramic and copper can cause high stress in the package that can cause warping and cracking of the package near the connection between these materials.

One example of such packages is an air cavity package that typically includes one or more semiconductor device die attached to a base plate and an insulative window frame surrounding the die. A cap is placed over the window frame, sealing the die in a cavity of air. Air cavity packages can be used to house high frequency devices such as radio-frequency (RF) die. Packaging a high frequency semiconductor device in encapsulated air can improve high frequency properties of the die and electrical leads, as compared to encapsulation in a molding compound that has a higher dielectric constant than air.

Figure 1:
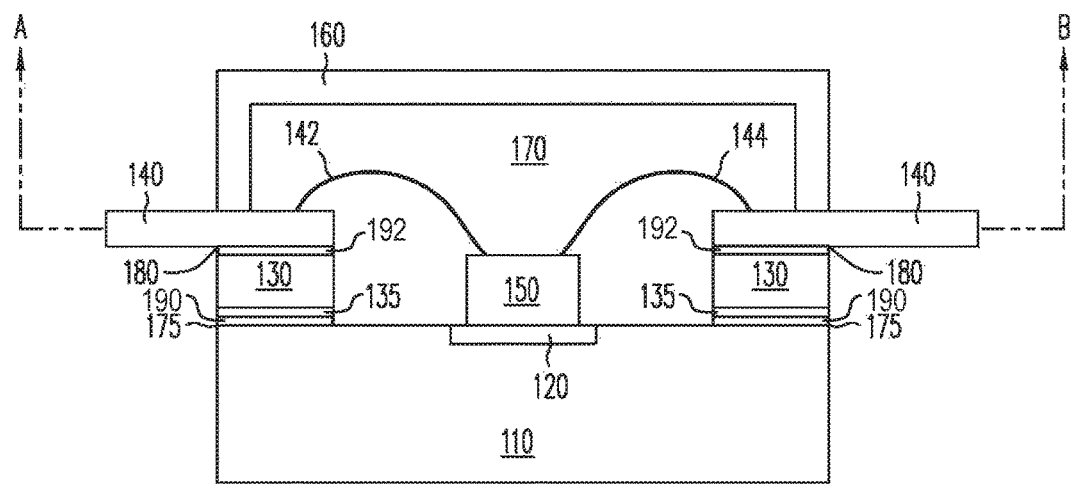
FIG. 1 is a simplified block diagram illustrating a cross-sectional view of an air cavity package.
Figure 2:
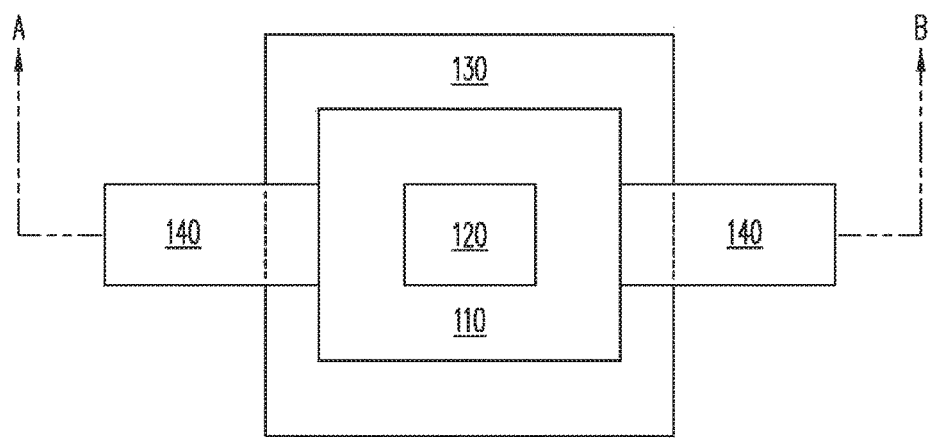
FIG. 2 is a simplified block diagram illustrating a plan view of the air cavity package.

FIG. 1 is a simplified block diagram illustrating a cross-sectional view of an air cavity package 100. FIG. 2 is a simplified block diagram illustrating a plan view of air cavity package 100. An air cavity package uses a conductive metal base plate 110 that can incorporate a die attach region 120. A window frame 130 made of a ceramic material is attached to the conductive metal base plate. Window frame 130 is generally attached to the conductive metal base plate prior to a die attach process. Conductive leads 140 are disposed on a top surface of the window frame and are used to make electrical contact 142 and 144 to a die 150 included in the package. Conductive leads 140 can be inserted into a recess along the top of window frame 130. A cap 160 is attached to the top of the leads and the window frame, which seals a cavity 170.

Conventional processes for forming an air cavity package, such as that illustrated in FIG. 1, involve attaching window frame 130 to conductive metal base plate 110 using a high temperature brazing process (e.g., 850° C.). Such high processing temperatures preclude use of copper base plates with ceramic window frames because a coefficient of thermal expansion (CTE) mismatch between copper and ceramic materials induces cracks in the ceramic window frame at brazing temperatures. Thus, conductive metal base plate 110 is typically made of a CuMOCu or Cu(CuMo)Cu laminate or CuW when a ceramic window frame is used. But both CuMOCu and Cu(CuMo)Cu laminates, as well as CuW, have significantly lower thermal conductivity than pure copper, which reduces the overall thermal performance of the package.

While epoxies can be used to attach a ceramic window frame to a metal base plate prior to die attach, epoxies can be damaged during subsequent high temperature die attach processes and thereby have a lower reliability. While some conventional air cavity techniques can involve attaching the window frame after die attach, those window frames are typically constructed of plastic which has a much lower thermal conductivity and capacitance than a ceramic window frame. This can limit the use of air cavity packages with plastic window frames to lower power applications.

Embodiments of the present invention provide for using silver 190, 192 as an interface material between ceramic window frame 130 and both conductive metal base plate 110 and conductive leads 140 (e.g., at interface regions 175 and 180). The silver 190, 192 is applied using a low-temperature sintering technique in which a fine particle silver paste, powder, or film is applied to the region of interest under heat and pressure. The silver particles are of nano-scale, and therefore surface energies of the molecules forming the particles can dominate interactions between the particles, including surface tension, thereby allowing for formation of solid silver at a temperature significantly lower than the melting point of silver. Once the solid silver region is formed, a typical melting point of the silver applies (i.e., approximately 960° C.).

In the air cavity package illustrated in FIGS. 1 and 2, a silver sintering process can be performed by applying fine particle silver 190 to conductive metal base plate 110 at interface region 175. Ceramic window frame 130 is then applied to the fine particle silver at a temperature and pressure sufficient to cause the silver particles to bond to one another and to the materials of the ceramic window frame and the conductive metal base plate. In order to enhance the bonding between the silver and the ceramic window frame, the ceramic window frame can be metalized using a number of metalizing techniques known in the art (metallization layer 135). For example, the ceramic window frame can be metalized using a direct plated copper process, a directed bonded copper process, a refractory metal fire plus nickel/gold plating, or a thin film process using TiNiAu, TiW, gold, and the like.

In one embodiment, the temperature used during the sintering process is between approximately 200-300° C., and typically around 250° C., well below brazing temperatures used for prior art air cavity packages. Similarly, fine particle silver 192 can be applied at interface region 180 on ceramic window frame 130 and conductive leads 140 can be applied under a temperature and pressure to cause the silver particles to bond. The sintered silver 190, 192 at the interfaces provides a dual effect, an adhesive coupling of the differing materials together and an electrical/thermal coupling.

Fine particle silver can be applied using a variety of techniques. A paste containing the fine particle silver can be used. Such a paste can be sprayed on, printed on, or otherwise applied. A powder form of the fine particle silver can also be used, and applied using similar methods. Alternatively, a pre-formed film incorporating fine particle silver and organic materials can be used by placing the film between parts desired to be bonded under a low temperature (e.g., 250° C.) and added pressure. The organic material of the film is removed under such process conditions and the solid silver is formed.

Since the bonding process is performed at significantly lower temperatures than that of prior art brazing techniques, effects due to the differing CTE of ceramic and metal are avoided (e.g., ceramic cracking and warping). Further, less expensive and more efficient materials can be used for conductive metal base plate 110. For example, a solid copper flange can be used instead of a laminate flange as the conductive metal base plate. In addition, conductive leads 140 can be formed of a solid copper rather than an alloy. In both cases, use of solid copper, rather than a laminate or an alloy, improves electrical conductivity and, in the case of the conductive metal base plate, thermal conductivity. Solid copper also provides significant cost benefits over laminates and alloys. A die attach region for the flange can include, for example, AuSi, AuSn, or sintered silver. In addition, according to the needs of the application, the package system can be plated to cover the sintered silver, using, for example, NiAu or NiPdAu at various stages of the package buildup (e.g., before die attach and after hermetic lidding).

Another semiconductor device package structure that can derive benefits from use of sintered silver is for high power devices employing metal coins in a package substrate or PCB. Traditionally, power components are provided to a system using individually packaged components that are coupled to the system PCB. A heat sink is coupled to the power component package. Therefore, there can be multiple connections between a power device die in the component package and the heat sink. This can result in an inefficient transfer of heat from the power device die to the heat sink. In addition, the power component package, along with all the various connections, can take up significant space in the system package. Further, since there are limited provided geometries of the packaged components, the use of those packaged components limits the flexibility of system geometries.

Figure 3:
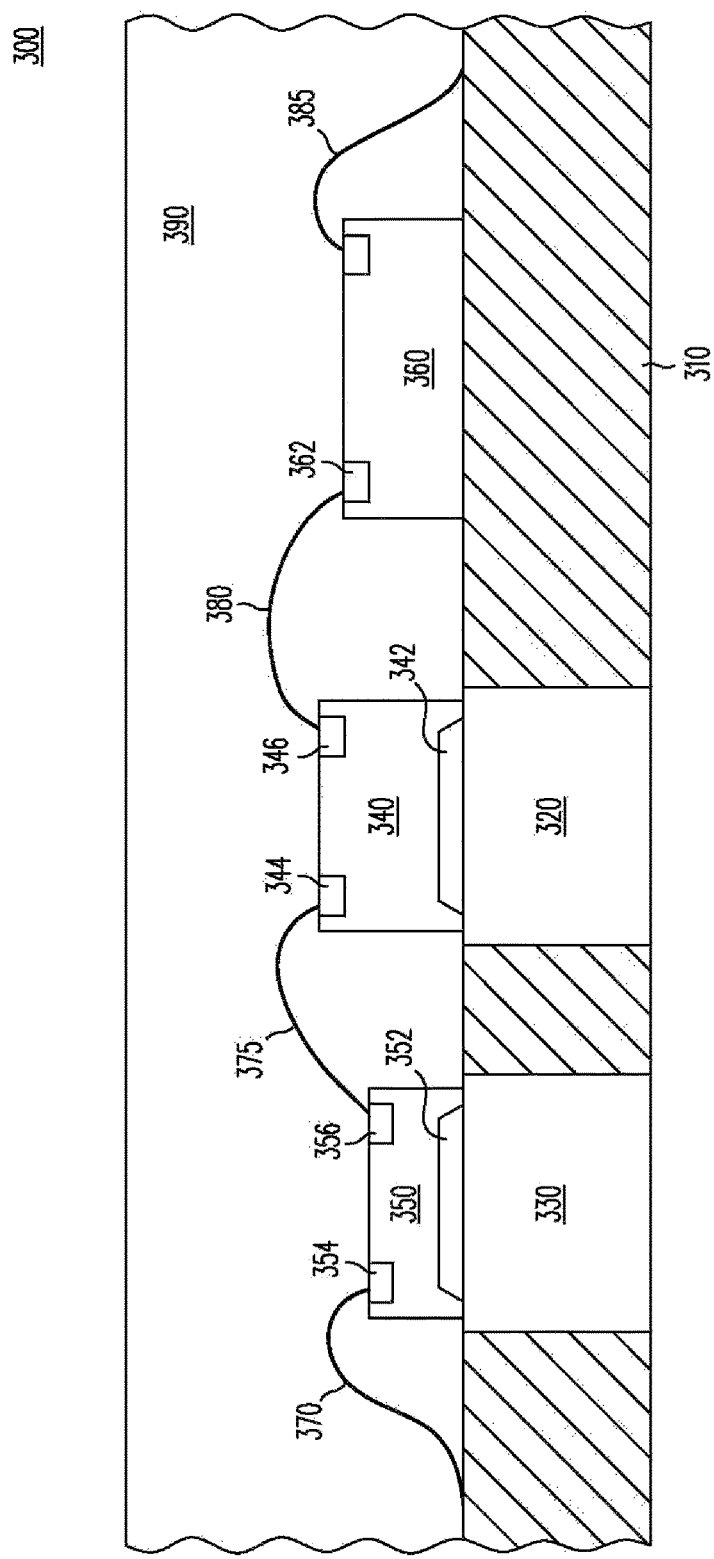
FIG. 3 is a simplified block diagram of a cross sectional view of a system at a stage in processing in which device die are coupled to metal coins or slugs embedded in a PCB or other package substrate.

FIG. 3 is a simplified block diagram of a cross sectional view of a system 300 at a stage in processing in which power device die are coupled to metal coins or slugs embedded in a PCB or other package substrate (alternatively, the power device die or passive device die could be coupled to the metal coins or slugs to enhance grounding). System 300 includes a package substrate 310, such as a PCB. Package substrate 310 has embedded metal coins 320 and 330. The metal coins have a high thermal or electrical conductivity, depending upon the application. For many thermal applications, a copper coin is used because of copper's high electrical and thermal properties. Further, copper can be readily incorporated into circuit board designs. In the examples below, the metal coins are specifically discussed to be copper, but other metals (e.g., aluminum) and composites (e.g., AlSiC, Ag diamond, and Cu graphite) with high thermal or electrical conductivity can be used, as the application warrants.

As will be discussed more fully below, embedded copper coins 320 and 330 can be embedded using methods known in the art, as appropriate to the application. Power device die 340 and 350 are coupled to embedded copper coins 320 and 330 respectively. As will be discussed more fully below, the methods for coupling the power device die to the embedded copper coins depend upon the application. Power device die 340 and 350 are coupled to the embedded copper coins at coupling regions 342 and 352, respectively. The coupling regions can be thermal or electrical or both, depending upon the application. On the major surface of the power device die opposite the major surface including the coupling regions, power device die 340 includes terminal pads 344 and 346, while power device die 350 includes signal pads 354 and 356. A device die 360 is shown as adhesively coupled to package substrate 310. Device die 360 can be any component not needing the advantages of being coupled to an embedded copper coin, such as a low power device die or a passive component. Device die 360 includes terminal pads, such as terminal pad 362, on the major surface opposite that coupled to the package substrate.

The power device die can be coupled to the embedded copper coins in a variety of ways, depending upon whether the copper coin is embedded in a preassembled PCB or is initially separate from a PCB and the PCB then assembled around the copper coin after attachment to the power device die. In those instances where the copper coin is embedded in a preassembled PCB, methods for attaching the power device die to the copper coin should take into account temperature limitations associated with processing of a premade PCB. That is, if too a high temperature is used in coupling the power device die to the embedded copper coin, then damage may occur to other areas of the premade PCB. Such a coupling can be performed using a low-temperature silver die attach. Low-temperature silver die attach methods known in the art can form an acceptable bond between the silicon die and the copper coin using temperatures of approximately 250° C. Such low-temperature die attach techniques include the use of nanoscale silver pastes or sintered silver, as discussed above, and typically provide better electrical, thermal and thermomechanical properties than traditional solder techniques. As stated above, another advantage of using low-temperature die attach techniques to couple the power device die to the embedded copper coins is avoiding damage to the remaining portions of the PCB.

Wire bonds 370, 375, 380, and 385 are used to couple the contact pads on the active surface of power device die 340 and 350 and device die 360 with one another and with contact pads provided on substrate 310 (not shown). An interconnect and other circuitry provided on the substrate (not shown) can provide additional connections between the various device die. Subsequent to formation of the communication net provided by the wire bonds, a molding material is applied over and around the power device dies, the device die, wire bonds, and over the substrate, forming an encapsulant 390 that encapsulates the structures within the molding material and forms a panel.

The molding material can be any appropriate encapsulant including, for example, silica-filled epoxy molding compounds, plastic encapsulation resins, and other polymeric materials such as silicones, polyimides, phenolics, and polyurethanes. The molding material can be applied by a variety of standard processing techniques used in encapsulation including, for example, printing, pressure molding, and spin application. Once the molding material is applied, the panel can be cured by exposing the materials to certain temperatures for a period of time, or by applying curing agents, or both. In a typical encapsulation process, a depth of encapsulant 390 can exceed a maximum height of structures embedded in the molding material.

In an alternative embodiment, the wire bonded structures of FIG. 3 can be packaged as an air cavity system. In such a case, encapsulant would not be used to cover the various components of the system. Instead, a pre-molded cavity package can be used to surround the various components and a cap or a lid can replace the encapsulant to protect the components within the cavity package. In some instances, a silicone gel can be used to further protect the components by being applied over and around the components and the wire bonds. In a further alternative embodiment, the wires can be replaced with a redistributed chip scale package system to provide the package interconnects.

As discussed above, embedded copper coins 320 and 330 are typically embedded in substrate 310 using a variety of techniques known in the art. One technique involves building up the substrate (e.g., PCB) around the copper coins. The coins are at least mechanically attached to the built up substrate, and can also be electrically coupled to the substrate as the substrate is built up, according to the needs of the application. Another technique involves press fitting the coins in a pre-built up substrate. In such a situation, the embedded copper coins are mechanically attached to the substrate. A disadvantage of both of these prior art methods for incorporating embedded copper coins is the necessary thickness of the substrate. In typical applications, the substrate would be between 32 (e.g., built up) and 40 (e.g., press fit) mils.

Figure 4:
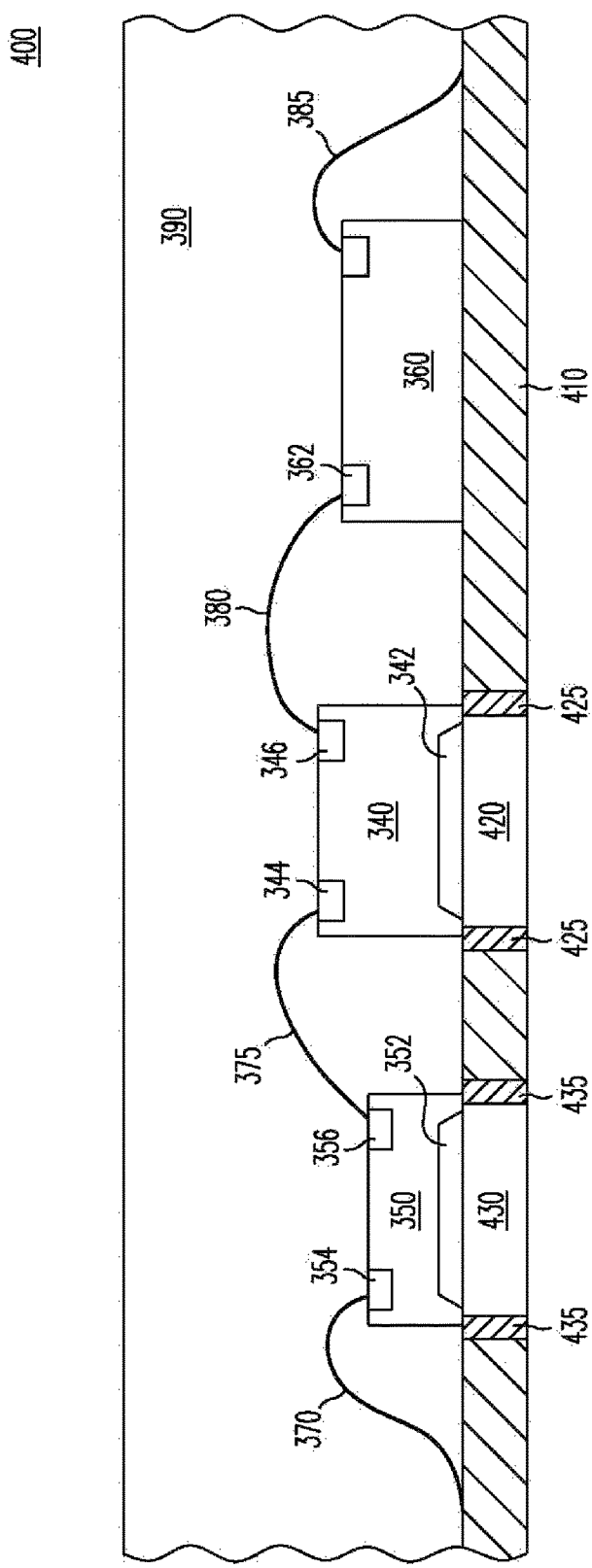
FIG. 4 is a simplified block diagram of a cross sectional view of a system at a stage in processing in which device die are coupled to sintered silver vias in a PCB or other package substrate.

FIG. 4 is a simplified block diagram of a cross sectional view of a system 400 at a stage in processing in which power device die are coupled to sintered silver vias in a PCB or other package substrate. FIG. 4 is an alternative to the structure of FIG. 3 in that the embedded copper coins of FIG. 3 are replaced by large vias 430 and 440. Large vias 420 and 430 are formed from sintered silver and bonded to the organic material of substrate 410. The sintered silver material can be directly bonded to the organic material of substrate 410 or, as shown, through an intermediate bonded plating metal 425 and 435 along edges of a drilled hole through the substrate for vias 420 and 430, respectively. As discussed above, sintered silver vias 420 and 430 can be formed using a fine particle silver paste applied within the via holes under a low temperature and added pressure, or using a pre-formed film under low temperature and added pressure. The silver bonds to the bonded plating metal which, in turn, is bonded to the multi-layer printed circuit board. Bonded plating metal 425 and 435 be a variety of plating metals, as appropriate to the application, and can typically be silver, copper, palladium, or gold.

As illustrated in FIG. 4, one advantage of using large vias formed of sintered silver is a significantly reduced thickness of the printed circuit board over PCBs incorporating embedded copper coins. Power device die 340 and 350 are thermally and/or electrically coupled to the large vias using techniques known in the art for coupling to silver (alternatively, passive semiconductor devices can be coupled to the large vias). The other components illustrated for system 400 correspond to similarly numbered elements of system 300 in FIG. 3.

Large via formation using sintered silver also provides opportunities for incorporation of other materials and devices within the large via region. This is due to the low temperature formation of the silver, and the electrical and thermal coupling properties of the formed silver.

Figure 5:
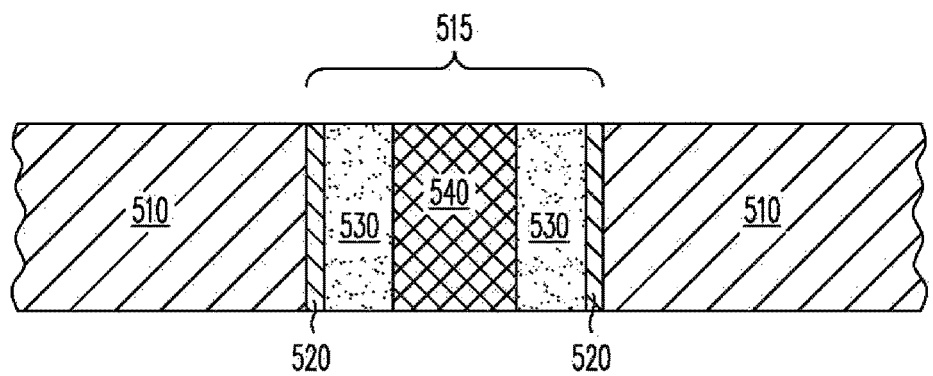
FIG. 5 is a simplified block diagram of a cross sectional view of a system at a stage in processing in which a copper slug is incorporated in a sintered silver large via.

FIG. 5 is a simplified block diagram of a cross sectional view of a system at a stage in processing in which a copper slug is incorporated in a sintered silver large via. Substrate 510 includes a large via 515. Large via 515 can be plated along the edges using a plating metal such as gold, silver, or copper using techniques known in the art. Large via 515 further includes sintered silver 530 and a copper slug 540. Copper slug 540 can be placed into position before or after the application of a fine particle silver used for formation of sintered silver 530 (e.g., a nano-silver paste). The sintering process can then be applied in the large via region to form the large via having both sintered silver and the copper slug. Such a large via can incorporate both the advantages of the sintered silver (e.g., thinness, electrical, and cost) and the thermal advantages of copper. Alternative metallic slugs can be used in place of a copper slug, according to the needs of the application. Further, alternatively diamond or ceramics, such as low-temperature cofired ceramics (LTCC) having dielectric and conductive elements, can be included in the large via in place of copper slug 540.

Figure 6:
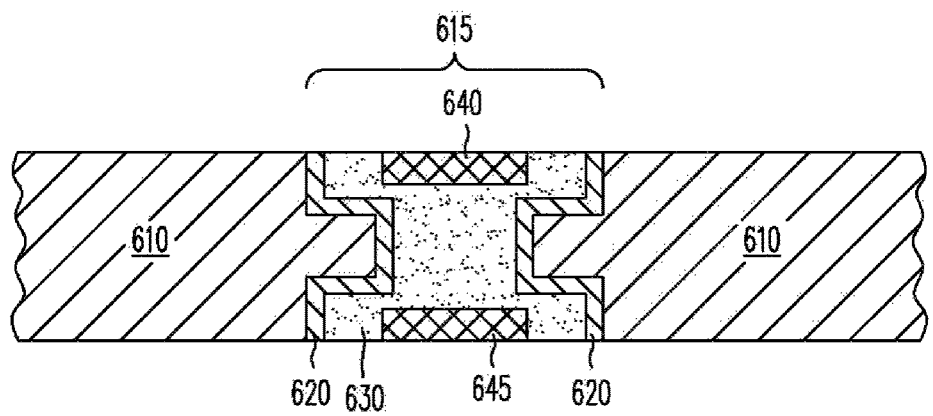
FIG. 6 is a simplified block diagram of a cross sectional view of a system at a stage in processing in which a pair of metal slugs are incorporated in a sintered silver large via.

FIG. 6 is a simplified block diagram of a cross sectional view of a system at a stage in processing in which a pair of metal slugs are incorporated in a sintered silver large via. Substrate 610 includes a large via 615. The large via can be formed by, for example, a drilling process or during build up of the substrate. The area of the through via along the major surfaces can be larger than that within the PCB. The sides of the large via are metalized using a plating metal such as gold, silver, or copper (e.g., 620). Sintered silver 630 and metal slugs 640 and 645 are incorporated in the via hole, wherein the silver is bonded to the metalizing 620. As with the embodiment in FIG. 5, the silver is introduced to large via 615 in the form of fine particle silver (e.g., a nano-silver paste) under a low temperature (e.g., 250° C.) and, in certain applications, an added pressure in order to form the sintered silver. Metal slugs 640 and 645 can be copper slugs or another metal, according to the application. Plating metal 620 can provide both a physical connection to the organic portion of the PCB along with an electrical connection to metalized interconnects within a laminate of the PCB or built up along the surfaces.

Figure 7:
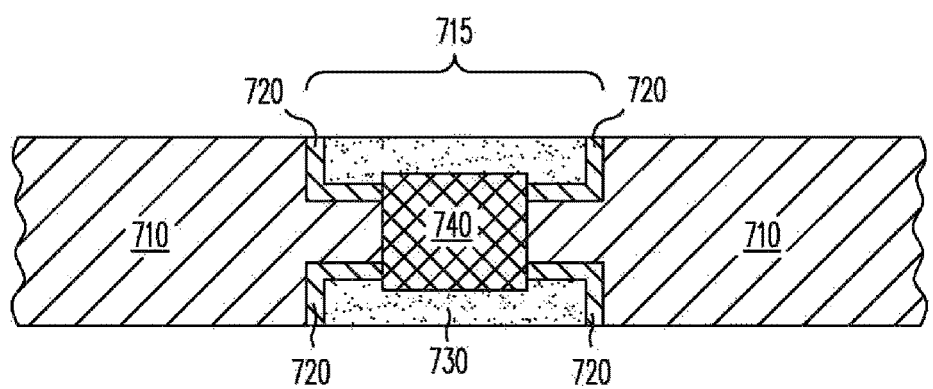
FIG. 7 is a simplified block diagram of a cross sectional view of a system at a stage in processing in which a passive component is incorporated in a sintered silver large via.

FIG. 7 is a simplified block diagram of a cross sectional view of a system at a stage in processing in which a passive component is incorporated in a sintered silver large via. Substrate 710 includes a large via 715. The large via can be formed by, for example, a drilling process or during build up of the substrate. The area of the through via along the major surfaces can be larger than that within the PCB. The sides of the top and bottom regions of the large via can be metalized using a plating metal such as gold, silver, or copper (e.g., 720). Sintered silver 730 is within the large via along with a low cost chip component 740. Low cost chip component 740 can be, for example, a high capacitance (HiC) component in an electrical pathway defined by sintered silver 730 and plating metal 720. As with the embodiment in FIG. 6, plating metal 720 can provide both a physical connection to the organic portion of the PCB along with an electrical connection to metalized interconnects within a laminate of the PCB or built up along the surfaces.

By now it should be appreciated that there has been provided a semiconductor device package that includes a first material portion that includes one of a ceramic or an organic material, a second material portion that includes a metallic material, and a sintered silver region disposed the adhesively couple the first and second material portions of the semiconductor device package. In one aspect of the above embodiment, the semiconductor device package is an air cavity package, the first material portion includes a metalized ceramic window frame, and the second material portion includes a conductive metal base plate. In a further aspect, the second material portion includes a solid copper metal base plate.

In another aspect of the above embodiment, the semiconductor device package is an air cavity package, the first material portion includes a metalized ceramic window frame, and the second material portion includes a conductive metal lead. A further aspect includes an air cavity cap. The air cavity cap is adhesively coupled to a surface of the metalized ceramic window frame and a surface of the conductive metal lead using a layer of sintered silver.

In another aspect of the above embodiment, the sintered silver region is formed by applying fine particles silver at a formation temperature lower than the melting point of silver. In a further aspect, the formation temperature is between approximately 200° C. and 300° C.

In another aspect of the above embodiment, the first material portion includes a printed circuit board, and the sintered silver region is disposed within a hole formed in the printed circuit board. In a further aspect, the second material portion is a metallic slug disposed within the sintered silver region. A still further aspect includes a semiconductor device die thermally coupled to the metallic slug where the metallic slug includes copper. Another further aspect includes a second metallic slug disposed within the sintered silver, where the sintered silver thermally and electrically couples the metallic slug and the second metallic slug. In another further aspect, the second material portion includes a passive electronic device disposed within the sintered silver region, where the sintered silver electrically couples the passive electronic device to an interconnect formed on the printed circuit board. In a still further aspect, the passive semiconductor device includes a high capacitance material.

Another embodiment of the present invention provides a method for forming a semiconductor device package. The method includes: forming, from a first material, a first material portion of the semiconductor device package where the first material includes one of a ceramic or an organic material; providing a second material portion of the semiconductor device package where the second material includes one of a ceramic or a metallic material; and, adhesively coupling the first and second material portions of the semiconductor device package using a sintered silver region.

In one aspect of the above embodiment, the semiconductor device package is an air cavity system, said forming the first material portion further includes forming a ceramic window frame, and the second material portion includes a conductive metal base plate. In another aspect, the semiconductor device package is an air cavity system, said forming the first material portion further includes forming a ceramic window frame, and the second material portion includes a conductive metal lead.

In another aspect of the above embodiment, adhesively coupling the first and second material portions further includes forming a sintered silver region by applying a fine particle silver at a formation temperature lower than the melting point of silver. In a further aspect, the formation temperature is between approximately 200° C. and 300° C.

In another aspect of the above embodiment, forming the first material portion further includes forming a printed circuit board and forming a hole in the PCB, and the adhesively coupling includes forming the sintered silver region within the hold in the PCB. A further aspect includes disposing the second material portion in the sintered silver region, where the second material portion is a metallic slug.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, metallic materials other than copper can be used in the various packages. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or an limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor device comprising:
   an insulative frame having a top surface and a bottom surface;
   a conductive metal lead coupled to the top surface of the insulative frame;
   a base plate having a top surface with an interface region;
   sintered silver between the bottom surface of the insulative frame and the interface region on the top surface of the base plate, wherein the sintered silver directly couples the bottom surface of the insulative frame to the top surface of the base plate;
   a semiconductor device die coupled to a die attach region of the base plate;
   an electrical contact between the semiconductor device die and the conductive metal lead; and
   an air cavity cap, wherein the air cavity cap is coupled to the top surface of the insulative frame and to the conductive metal lead.

2. The semiconductor device of claim 1, wherein:
   the insulative frame is formed from a ceramic material.

3. The semiconductor device of claim 1, wherein:
   the insulative frame includes a metallization layer on the bottom surface.

4. The semiconductor device of claim 1, wherein:
   the insulative frame is metalized with a material selected from copper, nickel/gold, TiNiAu, TiW, and gold.

5. The semiconductor device of claim 1, wherein:
   the base plate comprises solid copper.

6. The semiconductor device of claim 1, wherein:
   the base plate comprises at least one material selected from a copper-molybdenum-copper (CuMoCu) laminate, a copper, copper-molybdenum, copper (Cu(CuMo)Cu) laminate, and copper-tungsten (CuW).

7. The semiconductor device of claim 1, further comprising:
   plating comprising a gold-containing material.

8. The semiconductor device of claim 1, wherein:
   the conductive metal lead is coupled to the top surface of the insulative frame with the sintered silver.

9. The semiconductor device of claim 8, wherein:
   the conductive metal lead comprises solid copper.

10. The semiconductor device of claim 1, wherein further comprising:
    the semiconductor device die is coupled, with the sintered silver, to the die attach region of the base plate.

11. The semiconductor device package of claim 1, further comprising:
    a semiconductor device die coupled to a die attach region of the base plate with the sintered silver.

12. A semiconductor device comprising:
    an insulative ceramic frame having a top surface and a bottom surface;
    a conductive metal lead coupled to the top surface of the insulative ceramic frame;
    a solid copper base plate having a top surface with an interface region;
    sintered silver between the bottom surface of the ceramic frame and the interface region on the top surface of the base plate, wherein the sintered silver directly couples the bottom surface of the ceramic frame to the top surface of the base plate;
    a semiconductor device die coupled to a die attach region of the base plate;
    an electrical contact between the semiconductor device die and the conductive metal lead; and
    an air cavity cap, wherein the air cavity cap is coupled to the top surface of the insulative frame and to the conductive metal lead.

13. The semiconductor device of claim 12, wherein:
    the ceramic frame includes a metallization layer on the bottom surface.

14. The semiconductor device of claim 12, wherein:
    the insulative frame is metalized with a material selected from copper, nickel/gold, TiNiAu, TiW, and gold.

15. The semiconductor device of claim 12, wherein:
    the conductive metal lead is coupled, with the sintered silver, to the top surface of the ceramic frame.

16. The semiconductor device of claim 15, wherein:
    the conductive metal lead comprises solid copper.

17. The semiconductor device of claim 12, wherein further comprising:
    the semiconductor device die is coupled, with the sintered silver, to the die attach region of the base plate.

* * * * *